(12) United States Patent
Qiao et al.

(10) Patent No.: US 11,336,274 B2
(45) Date of Patent: May 17, 2022

(54) CLAMP CIRCUIT AND POWER MODULE USING THE SAME

(71) Applicant: Delta Electronics (Shanghai) CO., LTD, Shanghai (CN)

(72) Inventors: Lifeng Qiao, Shanghai (CN); Wuying Li, Shanghai (CN); Dehui Zhang, Shanghai (CN); Teng Liu, Shanghai (CN); Jianping Ying, Shanghai (CN)

(73) Assignee: Delta Electronics (Shanghai) CO., LTD, Shanghai (CN)

( * ) Notice: Subject to any disclaimer, the term of this patent is extended or adjusted under 35 U.S.C. 154(b) by 0 days.

(21) Appl. No.: 16/943,272

(22) Filed: Jul. 30, 2020

(65) Prior Publication Data

US 2021/0036695 A1 Feb. 4, 2021

(30) Foreign Application Priority Data

Aug. 2, 2019 (CN) .......................... 201910713827.X

(51) Int. Cl.
*H03K 17/08* (2006.01)
*H02H 9/04* (2006.01)
(Continued)

(52) U.S. Cl.
CPC .............. *H03K 17/08* (2013.01); *H02H 9/04* (2013.01); *H02M 1/34* (2013.01); *H02M 3/156* (2013.01);
(Continued)

(58) Field of Classification Search
CPC ............ H03K 17/08; H02H 9/04; H02H 3/20; H02H 7/09; H02M 1/34; H02M 3/156; H02M 1/44; H02M 1/08; H01L 27/06
(Continued)

(56) References Cited

U.S. PATENT DOCUMENTS 5,946,178 A * 8/1999 Bijlenga ................ H02M 7/538
361/91.5
7,009,828 B2 * 3/2006 Ito ........................... H02M 1/08
361/91.7
(Continued)

FOREIGN PATENT DOCUMENTS

CN 103683260 A 3/2014
CN 104052048 A 9/2014
(Continued)

OTHER PUBLICATIONS

Alagu Dheeraj "Comparison of active clamping circuits for isolated forward converter",dated Nov. 8, 2017.
(Continued)

*Primary Examiner* — Danny Nguyen
(74) *Attorney, Agent, or Firm* — Qinghong Xu

(57) ABSTRACT

The present disclosure mainly provides a clamping circuit, coupled to a first end and a second end of a switching transistor through a first node and a second node, comprising: an RCD circuit, comprising a first resistor and a first capacitor connected in parallel between the second node and a third node, and a diode having a negative electrode coupled to the third node; and a first stabilivolt diode, having a negative electrode coupled to the first node and a positive electrode coupled to a positive electrode of the diode at a fourth node.

13 Claims, 6 Drawing Sheets

(51) Int. Cl.
  *H02M 1/34* (2007.01)
  *H02M 3/156* (2006.01)
  *H02M 1/44* (2007.01)
  *H02H 3/20* (2006.01)
  *H02H 7/09* (2006.01)

(52) U.S. Cl.
  CPC ................ *H02H 3/20* (2013.01); *H02H 7/09* (2013.01); *H02M 1/44* (2013.01)

(58) Field of Classification Search
  USPC .............................................. 361/91.1, 91.7
  See application file for complete search history.

(56) References Cited

U.S. PATENT DOCUMENTS

| | | | | |
|---|---|---|---|---|
| 9,768,607 | B2* | 9/2017 | Li | H02M 1/34 |
| 11,049,670 | B2* | 6/2021 | Dupraz | H01H 33/596 |
| 2007/0121257 | A1* | 5/2007 | Maitra | H01H 9/542 |
| | | | | 361/2 |
| 2015/0002977 | A1* | 1/2015 | Dupraz | H01H 9/542 |
| | | | | 361/115 |
| 2016/0126726 | A1* | 5/2016 | Chi | H02J 3/36 |
| | | | | 361/56 |
| 2018/0287486 | A1* | 10/2018 | Peng | H02M 1/34 |
| 2019/0020264 | A1* | 1/2019 | Ou | H02M 3/33507 |
| 2019/0273440 | A1* | 9/2019 | Ikarashi | F16F 1/3615 |

FOREIGN PATENT DOCUMENTS

| | | |
|---|---|---|
| CN | 107046361 A | 8/2017 |
| CN | 206743100 U | 12/2017 |
| CN | 207053167 U | 2/2018 |
| CN | 108736874 A | 11/2018 |
| CN | 109474166 A | 3/2019 |
| CN | 109889028 A | 6/2019 |
| EP | 2549649 A1 | 1/2013 |
| EP | 2757688 A1 | 7/2014 |

OTHER PUBLICATIONS

Yan Gao "A New Method of MOSFET SiC Series Voltage Sharing Circuit in High Voltage Pulse Generator", dated Feb. 28, 2017.
The 1st Office Action dated Jul. 5, 2021 for CN patent application No. 201910713827.X.

* cited by examiner

CLAMP CIRCUIT AND POWER MODULE USING THE SAME

CROSS REFERENCE

This application is based upon and claims priority to Chinese Patent Application No. 201910713827.X, filed on Aug. 2, 2019, the entire content thereof are incorporated herein by reference.

TECHNICAL FIELD

The present disclosure relates to the field of electronic circuit technology, and in particular, to a clamp circuit and a power module using the same.

BACKGROUND

A clamp circuit is usually connected in parallel to a semiconductor switching transistor, and absorbs voltage spikes generated by circuit leakage inductance current on the semiconductor switching transistor when the semiconductor switching transistor is instantaneously turned off, so as to prevent the semiconductor switching transistor from damage caused by voltage surge across the semiconductor switching transistor exceeding the withstand voltage of the semiconductor switching transistor.

In the related art, the clamp circuit is usually a capacitance clamp circuit or a resistance capacitor diode (RCD) clamp circuit. In the capacitor clamp circuit, the clamp capacitor needs to be selected according to the voltage of the switching transistor to be clamped, and generally the capacitor volume is relatively large. When the switching transistor is turned on, charge stored on the clamp capacitor is discharged through the channel of the switching transistor, causing the switching transistor to generate heat. When the switching transistor is instantaneously turned off, circuit leakage inductance resonates with the clamp capacitor to generate a turn-off spike of more than 2 times the input voltage. Therefore, the cost and size of the capacitor clamp circuit are relatively high, and the clamping effect thereof is poor.

The resistor capacitor diode (RCD) clamp circuit is formed by adding a diode and a resistor to the capacitor clamp circuit. The diode is used for preventing the charge on the capacitor from flowing through the channel of the switching transistor to cause the switching transistor to generate heat. The resistor is used for discharging the capacitor, to prevent continues rise of the capacitor voltage caused by charge accumulation. However, since the resistor, capacitor and diode in the RCD clamp circuit needs to match the rated voltage of the switching transistor, and the resistor has a certain energy dissipation requirement, the size of the device is relatively large. In addition, the residual voltage on the capacitor is related to turn-on duration, and the residual voltage on the capacitor affects the value of the turn-off spike voltage. Therefore, the clamping effect is affected by turn-on time, and the clamping effect is unstable.

It should be understood that information disclosed in the background section above is only for enhancing the comprehension of the background of the present disclosure, and thus may include information that does not constitute prior art known to those ordinary skilled in the art.

SUMMARY

An object of the present disclosure is to provide a clamp circuit and a power module using the same, which are used to overcome, at least to some extent, the problem that a clamp circuit device is large in size and has an unstable clamping effect due to limitations and disadvantages of the related art.

According to a first aspect of the present disclosure, there is provided clamping circuit, coupled to a first end and a second end of a switching transistor through a first node and a second node, comprising:

an RCD circuit, comprising a first resistor and a first capacitor connected in parallel between the second node and a third node, and a diode having a negative electrode coupled to the third node; and a first stabilivolt diode, having a negative electrode coupled to the first node and a positive electrode coupled to a positive electrode of the diode at a fourth node.

In an exemplary embodiment of the present disclosure, the circuit further comprises:

a second stabilivolt diode, having a negative electrode coupled to the fourth node; and a second resistor, coupled between the second node and a positive electrode of the second stabilivolt diode.

In an exemplary embodiment of the present disclosure, when voltage between the first end and the second end of the switching transistor exceeds reverse breakdown voltage of the first stabilivolt diode, the first stabilivolt diode is turned on, and the first stabilivolt diode and the RCD circuit together clamp the voltage between the first end and the second end of the switching transistor.

In an exemplary embodiment of the present disclosure, when voltage between the first end and the second end of the switching transistor exceeds reverse breakdown voltage of the first stabilivolt diode, the first stabilivolt diode is turned on, and the first stabilivolt diode and the RCD circuit together clamp the voltage between the first end and the second end of the switching transistor; and when voltage of the first capacitor exceeds reverse breakdown voltage of the second stabilivolt diode, the second stabilivolt diode is turned on, and the first stabilivolt diode, the second stabilivolt diode and the second resistor together clamp the voltage between the first end and the second end of the switching transistor.

In an exemplary embodiment of the present disclosure, the circuit further comprises:

a third resistor, coupled between the second node and the fourth node.

In an exemplary embodiment of the present disclosure, the first stabilivolt diode and the third resistor are used for discharging leakage current of the switching transistor.

According to a second aspect of the present disclosure, there is provided a power module, comprising: N switching transistors connected in series with each other and N clamp circuits, wherein each of the clamp circuits is coupled in parallel to a first end and a second end of the corresponding switching transistor through a first node and a second node, and each of the clamp circuits comprises:

an RCD circuit, comprising a first resistor and a first capacitor connected in parallel between the second node and a third node, and a diode having a negative electrode coupled to the third node; and a first stabilivolt diode, having a negative electrode coupled to the first node and a positive electrode coupled to a positive electrode of the diode at the a fourth node.

In an exemplary embodiment of the present disclosure, each of the N clamp circuits further comprises:

a second stabilivolt diode, having a negative electrode coupled to the fourth node; and a second resistor, coupled between the second node and a positive electrode of the second stabilivolt diode.

In an exemplary embodiment of the present disclosure, in each of the N clamp circuits, when voltage between the first end and the second end of the switching transistor exceeds reverse breakdown voltage of the first stabilivolt diode, the first stabilivolt diode is turned on, and the first stabilivolt diode and the RCD circuit together clamp the voltage between the first end and the second end of the switching transistor.

In an exemplary embodiment of the present disclosure, in each of the N clamp circuits, when voltage between the first end and the second end of the switching transistor exceeds reverse breakdown voltage of the first stabilivolt diode, the first stabilivolt diode is turned on, and the first stabilivolt diode and the RCD circuit together clamp the voltage between the first end and the second end of the switching transistor; and when voltage of the first capacitor exceeds reverse breakdown voltage of the second stabilivolt diode, the second stabilivolt diode is turned on, and the first stabilivolt diode, the second stabilivolt diode and the second resistor together clamp the voltage between the first end and the second end of the switching transistor.

In an exemplary embodiment of the present disclosure, each of the N clamp circuits further comprising:

a third resistor, coupled between the second node and the fourth node.

In an exemplary embodiment of the present disclosure, the first stabilivolt diode and the third resistor are used for discharging leakage current of the switching transistor.

In an exemplary embodiment of the present disclosure, any one or more of the N clamp circuits simultaneously comprises the second resistor and the third resistor.

The embodiment of the present disclosure divides the spike voltage across the switching transistor by using a stabilivolt diode, and prevents the clamp circuit from operating before the voltage across the switching transistor is lower than the breakdown voltage of the stabilivolt diode, which can reduce the voltage withstand requirement of components in the RCD clamp circuit, thereby reducing the cost and size of the clamp circuit. Since the threshold that the RCD clamp circuit starts to operate is increased, and the resonance energy of the circuit leakage inductance is reduced, the spike voltage of the switching transistor at turn-off can be lowered.

It should be understood that the above general description and the following detailed description are merely exemplary and explanatory, which cannot limit to the present disclosure.

BRIEF DESCRIPTION OF THE DRAWINGS

The accompanying drawings, which are incorporated in the specification and constitute a part of the specification, show the embodiments in compliance with the present disclosure, and are used to interpret the principle of the present disclosure together with the description. It is apparent that the drawings in the following description are only some embodiments of the present disclosure, from which, other drawings may be obtained by those ordinary skilled in the art without paying any creative labor.

DETAILED DESCRIPTION

Figure 1:
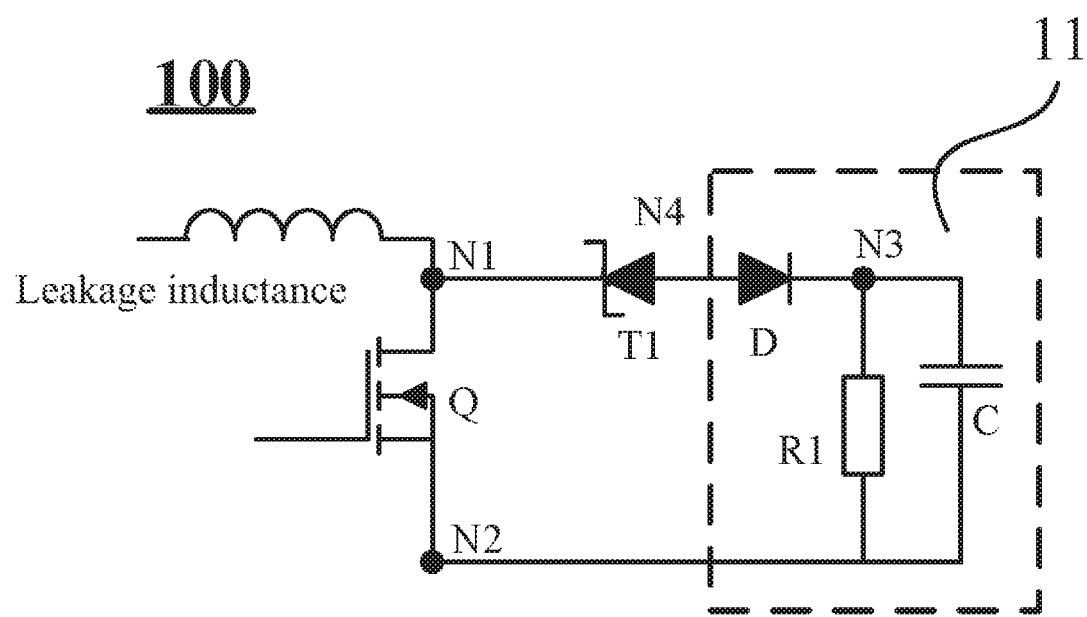
FIG. 1 is a schematic structural diagram of a clamp circuit in a first embodiment of the present disclosure.

Exemplary embodiments will now be described more fully with reference to the accompanying drawings. However, the exemplary embodiments may be embodied in many forms and should not be construed as limited to the examples set forth herein; rather, these embodiments are provided so that this disclosure will be more thorough and complete, and will fully convey the concept of the exemplary embodiments to those skilled in the art. Furthermore, the described features, structures, or characteristics may be combined in any suitable manner in one or more embodiments. In the following description, numerous specific details are given to provide a thorough understanding of embodiments of the present disclosure. Those skilled in the art will realize that the technical solutions of the present disclosure may be practiced without one or more of the specific details, or other methods, components, apparatus, steps, etc. may be utilized. In other instances, well-known technical solutions are not shown or described in detail to avoid obscuring respective aspects of the present disclosure.

In addition, the accompanying drawings are merely schematic representations of the present disclosure. The same reference numerals in the drawings represent the same or similar parts, so the repeated description thereof will be omitted. Some of the block diagrams shown in the accompanying drawings are functional entities and do not necessarily correspond to physically or logically separate entities. These functional entities may be implemented in software form, or in one or more hardware modules or integrated circuits, or implemented in different networks, processor devices and/or microcontroller devices.

The embodiments of the present disclosure will be described in detail below.

FIG. 1 is a schematic structural diagram of a clamp circuit in an exemplary embodiment of the present disclosure.

Referring to FIG. 1, the clamp circuit 100 is coupled to a first end and a second end of a switching transistor Q through a first node N1 and a second node N2 respectively, and the clamp circuit 100 may include:

a RCD circuit 11, including a first resistor R1 and a first capacitor C connected in parallel between the second node N2 and a third node N3, and a diode D having a negative electrode coupled to the third node N3; and a first stabilivolt diode T1, such as a Transient Voltage Suppressor (TVS), having a negative electrode coupled to the first node N1, and a positive electrode coupled to a positive electrode of the diode D at a fourth node N4.

In the present disclosure, the switching transistor Q may be an IGBT or a MOSFET. When the switching transistor Q is a MOSFET, the first end of the switching transistor Q is a drain electrode, the second end of the switching transistor Q is a source electrode. When the switching transistor Q is an IGBT, the first end of the switching transistor is a collector, and the second end of the switching transistor is an emitter.

When the first stabilivolt diode T1 is subjected to a reverse voltage near the critical value of the reverse voltage, the reverse current suddenly increases, and the reverse resistance suddenly drops to a small value. Although the reverse current varies over a wide range, the voltage across the stabilivolt diode is basically stable near the breakdown voltage, so as to achieve a voltage stabilization function.

In some embodiments of the present disclosure, the type of the stabilivolt diode may be, such as, a TVS (Transient Voltage Suppressor). As one kind of stabilivolt diode, TVS is a high-efficiency protection device in form of diode. When the two electrodes of the TVS are subjected to reverse transient high energy impact, the impedance of the TVS can be immediately reduced to a very low conduction value, allowing large current to pass, thereby absorbing surge power of up to several kilowatts and clamping the voltage between the two electrodes of the TVS to a preset value. Therefore the precise components in the electronic circuit are effectively protected against the surge pulses from being damaged. It has the advantages of fast response speed (in ps level), small device size, low clamping voltage and high reliability.

In the embodiment shown in FIG. 1, when the switching transistor Q is turned off, a turn-off voltage is generated between the first end and the second end of the switching transistor Q. The first stabilivolt diode T1 in the clamp circuit 100 is subjected to most of the turn-off voltage. When the turn-off voltage exceeds the reverse breakdown voltage of the first stabilivolt diode T1, the first stabilivolt diode T1 is instantaneously broken down, then the first stabilivolt diode T1, the first resistor R1, the capacitor C and the diode D together clamp the voltage across the switching transistor Q, and clamp the voltage across the switching transistor Q to a lower voltage. This voltage is determined by model and type of the stabilivolt diode. The leakage inductance current of the circuit leakage inductance flows to the first capacitor C of the RCD circuit 11 to charge the first capacitor C, so as to prevent the leakage inductance current from directly impacting the switching transistor Q to cause overvoltage on the switching transistor Q. When the switching transistor Q is turned on, the charge on the first capacitor C is discharged through the first resistor R1. Since the first stabilivolt diode T1 is subjected to most of the voltage, the components in the RCD circuit 11 can adopt the ones with a lower withstand voltage, such that the size and cost of the first resistor R1, the first capacitor C and the diode D can be reduced. When the RCD circuit 11 starts to operate, the voltage between the first end and the second end of the switching transistor Q is relatively high, but is divided by the first stabilivolt diode T1. As a result, the voltage on the RCD circuit is not high, such that the resonant process of the circuit leakage inductance and the clamping capacitor is shortened and the resonant energy thereof is reduced, thereby the turn-off spike voltage of the switching transistor is reduced.

Figure 2:
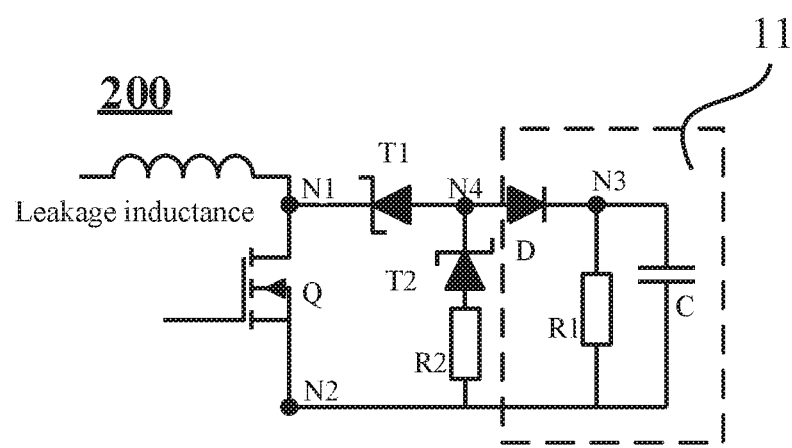
FIG. 2 is a schematic structural diagram of a clamp circuit in a second embodiment of the present disclosure.

FIG. 2 is a schematic structural diagram of a clamp circuit in another embodiment of the present disclosure.

Referring to FIG. 2, on the basis of the clamp circuit 100, the clamp circuit 200 further includes:

a second stabilivolt diode T2, having a negative electrode coupled to the fourth node N4; and second resistor R2, coupled between the second node N2 and a positive electrode of the second stabilivolt diode T2.

Like the clamp circuit 100, after the switching transistor Q is turned off and before the voltage between the first end and the second end of the switching transistor Q rises to the reverse breakdown voltage of the first stabilivolt diode T1, the RCD circuit 11 does not operate. When the voltage between the first end and the second end of the switching transistor Q exceeds the reverse breakdown voltage of the first stabilivolt diode T1, the first stabilivolt diode T1 is broken down, the first stabilivolt diode T1, the first resistor R1, the first capacitor C and the diode D participate in clamping as a first stage of dynamic voltage balancing circuit. The resistance value of the first stabilivolt diode T1 decreases at the moment of being broken down, the leakage current of the circuit leakage inductance is conducted into the first capacitor C of the RCD circuit 11 through the first stabilivolt diode T1, and charges the first capacitor C, thereby preventing the leakage current of the circuit leakage inductance from directly impacting the switching transistor Q to lead the turn-off voltage spike of the switching transistor Q to be too high.

In an exemplary embodiment of the present disclosure, the resistance of the second resistor R2 is relatively small, for example, far less than 1 MΩ. When the switching transistor Q is turned off, and if the spike voltage is too high or the duration of the spike voltage is too long, and the absorption capacity of the RCD circuit 11 is insufficient, the voltage of the first capacitor C exceeds the reverse voltage of the second stabilivolt diode T2, and the second stabilivolt diode T2 is broken down. At this time, the first stabilivolt diode T1, the second stabilivolt diode T2 and the second resistor R2 form a second stage of dynamic voltage balancing circuit, to clamp the voltage between the first end and the second end of the switching transistor Q. That is, the stabilivolt diode T1, the second stabilivolt diode T2 and the second resistor R2 are used as the second stage dynamic voltage balancing circuit to participate in clamping, thus to provide a stronger clamping ability. The clamp circuit 200 can further reduce the withstand voltage requirement of each component in the RCD circuit 11, thereby reducing the size and cost of the RCD circuit 11. In addition, the two stages of dynamic voltage balancing circuits can reduce the resonant energy of the circuit leakage inductance, and reduce the spike voltage of the switching transistor Q at the moment of turn-off, thus increasing the clamping reliability.

In another exemplary embodiment of the present disclosure, the resistance of the second resistor R2 is relatively large, for example, approaching 1 MΩ. When the switching transistor Q is in continuous off state, there is a very small leakage current flowing through the switching transistor Q. At this time, the circuit formed by the first stabilivolt diode T1, the second stabilivolt diode T2 and the second resistor R2 can function as static voltage balancing, to absorb the leakage current. Therefore it can be used to solve the problem of uneven voltage distribution in off state caused by different leakage current of the switching transistors when a plurality of stages of switching transistors are connected in series. By simultaneously setting the dynamic voltage balancing circuit, it can further reduce the resonant energy of the circuit leakage inductance, reduce the spike voltage when the switching transistor Q is turned off, and provide a good dynamic voltage balancing effect, thus improving clamping reliability.

By setting the series branch of the second stabilivolt diode T2 and the second resistor R2 that is connected in parallel to the RCD circuit 11, the clamp circuit 200 provided by the embodiment of the present disclosure can realize two-stage voltage balancing function, such as, two-stage dynamic voltage balancing, or one stage of dynamic voltage balancing with one stage of static voltage balancing, by adjusting the resistance setting of the second resistor R2, thereby enhancing clamping capability. Therefore, compared with the clamp circuit 100, the clamp circuit 200 has further improvements.

Figure 3:
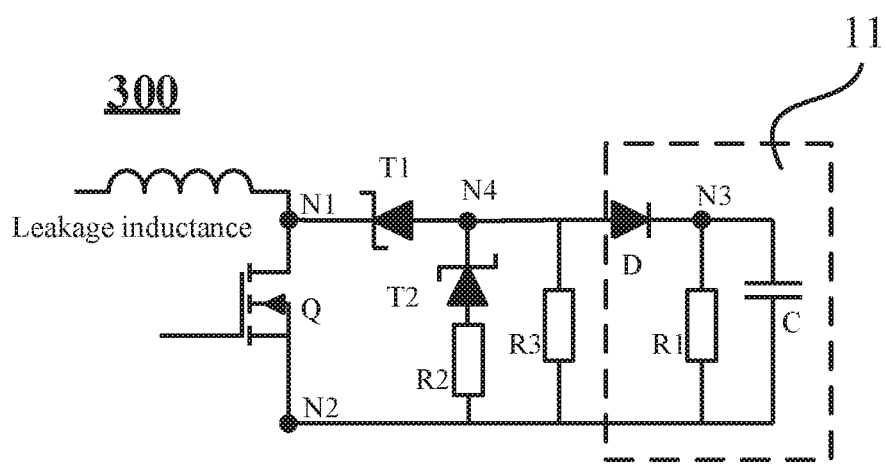
FIG. 3 is a schematic structural diagram of a clamp circuit in a third embodiment of the present disclosure.

FIG. 3 is a schematic diagram of a clamp circuit according to still another embodiment of the present disclosure.

Referring to FIG. 3, on the basis of the clamp circuit 200, the clamp circuit 300 further includes:

a third resistor R3, coupled between the second node N2 and the fourth node N4.

In an exemplary embodiment of the present disclosure, the resistance of the third resistor R3 is relatively large, for example, approaching 1MΩ. On the basis of the clamp circuit 200, the clamp circuit 300 adds the third resistor R3 connected in parallel to the RCD circuit 11, wherein the first stabilivolt diode T1 and the third resistor R3 function as static voltage balancing in the clamp circuit 300. When the switching transistor Q is off, the first stabilivolt diode T1 and the third resistor R3 can provide a discharge path for the leakage current of the switching transistor to achieve static voltage balancing. In the embodiment shown in FIG. 3, when the resistance of R2 is relatively small, the second resistor R2, the first stabilivolt diode T1 and the second stabilivolt diode T2 together form the second stage of dynamic voltage balancing circuit, so as to enhance clamping effect. When the resistance of R2 is large, the second resistor R2, the first stabilivolt diode T1 and the second stabilivolt diode T2 together form the static voltage balancing circuit. Due to the reduced operating voltage of the RCD circuit, components of the RCD circuit with lower voltage withstand can be adopted, thereby reducing the size and cost of the components, acquiring a good voltage spike suppression, and improving clamp reliability.

Figure 4:
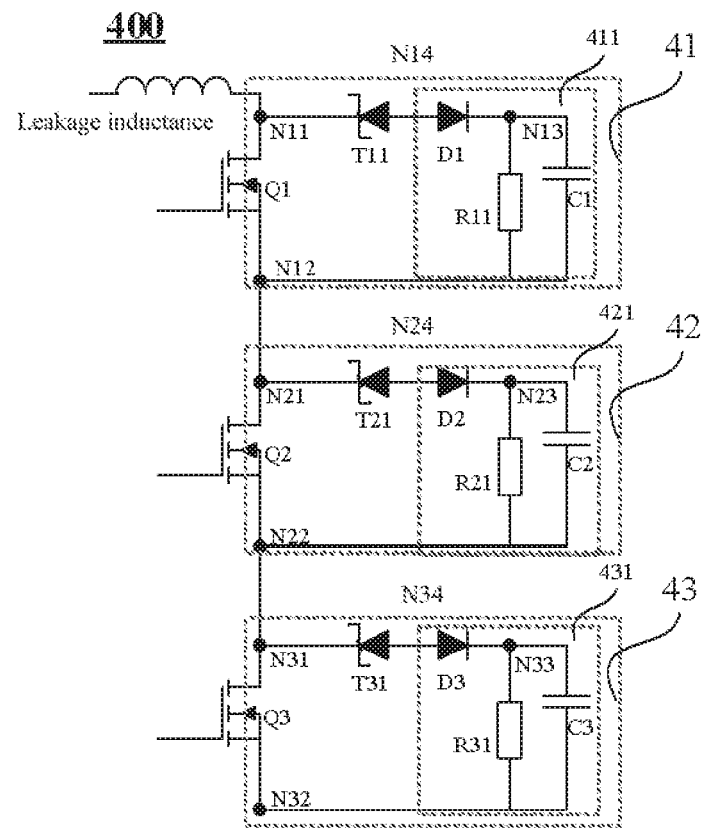
FIG. 4 is a schematic structural diagram of a power module in a fourth embodiment of the present disclosure.

FIG. 4 is a schematic diagram of a power module according to a fourth embodiment of the present disclosure. The power module of the embodiment shown in FIG. 4 includes N switching transistors Q1~QN connected in series and N clamp circuits 41~4N, and the clamp circuits and the switching transistors are in one-to-one correspondence. Each clamp circuit, through the first node and the second node, is coupled in parallel to the first end and the second end of the corresponding switching transistor. Taking the m-th clamp circuit 4m as an example, the clamp circuit 4m includes:

an RCD circuit 4m1, including a first resistor Rm1 and a first capacitor Cm connected in parallel between a second node Nm2 and a third node Nm3, and a diode Dm having a negative electrode coupled to the third node Nm3; and a first stabilivolt diode Tm1, having a negative electrode coupled to the first node Nm1, and a positive electrode coupled to a positive electrode of the diode Dm at a fourth node Nm4, wherein m is the order number of the switching transistor 4m.

In the embodiment shown in FIG. 4, the power module 400 includes three clamp circuits 41~43, each of which is the same as the clamp circuit 100. That is, the clamp circuit 100 can be applied to a power module with a plurality of switching transistors connected in series, wherein the number of the switching transistors connected in series is greater than or equal to 2. The RCD circuit 4m1 does not participate in the clamping before the voltage Vds between the first end and the second end of the switching transistor Qm rises to the reverse breakdown voltage of the first stabilivolt diode Tm1. When the voltage Vds between the first end and second end of the switching transistor Qm exceeds the reverse breakdown voltage of the first stabilivolt diode Tm1, the resistance of the first stabilivolt diode Tm1 decreases at the moment of being broken down, which conducts the leakage inductance current of the circuit leakage inductance into the first capacitor Cm of the RCD circuit 4m1. Since the operating voltage of the RCD circuit 4m1 decreases, components with lower withstand voltage can be adopted for the RCD circuit 4m1, thereby reducing the size and cost of the components. When a plurality of switching transistors are connected in series, the turn-off voltage spike suppression and dynamic voltage balancing capability can be effectively improved, for the switching transistors.

Figure 5:
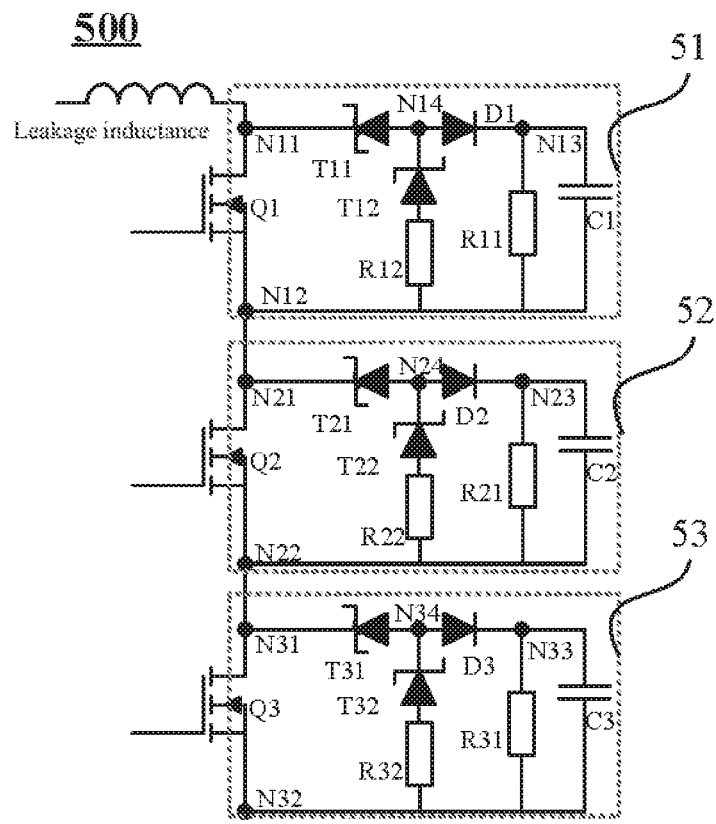
FIG. 5 is a schematic structural diagram of a power module in a fifth embodiment of the present disclosure.

FIG. 5 is a schematic diagram of a power module according to a fifth embodiment of the present disclosure. The embodiment shown in FIG. 5 is a scenario in which the clamp circuit 200 is applied to the power module.

Referring to FIG. 5, on the basis of the power module 400, the power module 500 sets the N clamp circuits by the clamp circuit 200. The clamp circuit 5m (such as, the clamp circuits 51~53) further includes:

a second stabilivolt diode Tm2, having a negative electrode coupled to the fourth node Nm4; and a second resistor Rm2, coupled between the second node Nm2 and a positive electrode of the second stabilivolt diode Tm2, wherein, m is the order number of the switching transistor 5m.

Like the clamp line 100, the clamp circuit 200 can also be applied to a power module in which a plurality of switching transistors are connected in series, and the number of the switching transistors is greater than or equal to 2.

In an exemplary embodiment of the present disclosure, the resistance of the second resistors Rm2 is small in the N clamp circuits, and the clamp circuit can provide two-stage dynamic voltage balancing. When the switching transistor Qm is turned off, the first stabilivolt diode Tm1 in the clamp circuit 5m is subjected to most of the turn-off voltage. When the turn-off voltage exceeds the reverse breakdown voltage of the first stabilivolt diode Tm1, the first stabilivolt diode Tm1 is instantaneously broken down. Then the first stabilivolt diode Tm1, the first resistor Rm1, the capacitor Cm and the diode Dm form the first stage of dynamic voltage balancing circuit to clamp the voltage across the switching transistor Qm. If the spike voltage is too high or the duration of the spike voltage is too long, and the absorption capacity of the RCD circuit 5m1 is insufficient, the voltage of the first capacitor Cm exceeds the reverse voltage of the second stabilivolt diode Tm2, and the second stabilivolt diode Tm2 is broken down. At this time, the first stabilivolt diode Tm1, the second stabilivolt diode Tm2 and the second resistor Rm2 form the second stage of dynamic voltage balancing circuit, to clamp the voltage between the first end and the second end of the switching transistor Qm. That is, the stabilivolt diode Tm1, the second stabilivolt diode Tm2 and the second resistor Rm2 are used as the second stage dynamic voltage balancing circuit to participate in clamping, thus to provide a stronger clamping ability, and enhance the dynamic voltage balancing effect for a plurality of switching transistors connected in series in the power module.

In an exemplary embodiment of the present disclosure, the resistance of the second resistor is relatively large in the N clamp circuits, thus the clamp circuit can provide static voltage balancing function. When the switching transistor QM is turned off, the first stabilivolt diode Tm1, in the clamp circuit 5m is subjected to the most of the turn-off voltage. When the turn-off voltage exceeds the reverse breakdown voltage of the first stabilivolt diode Tm1, the first stabilivolt diode Tm1 is instantaneously broken down. At this time, the first stabilivolt diode Tm1, the first resistor Rm1, the capacitor Cm and the diode Dm together form a stage of dynamic voltage balancing circuit for clamping the voltage across the switching transistor Qm. When the switching transistor Qm is in continuous off state, the first stabilivolt diode Tm1, the second stabilivolt diode Tm2 and the second resistor Rm2 form a stage of static voltage balancing circuit for absorbing the leakage current of the switching transistor, which functions a good static voltage balancing effect in the power module.

Figure 6:
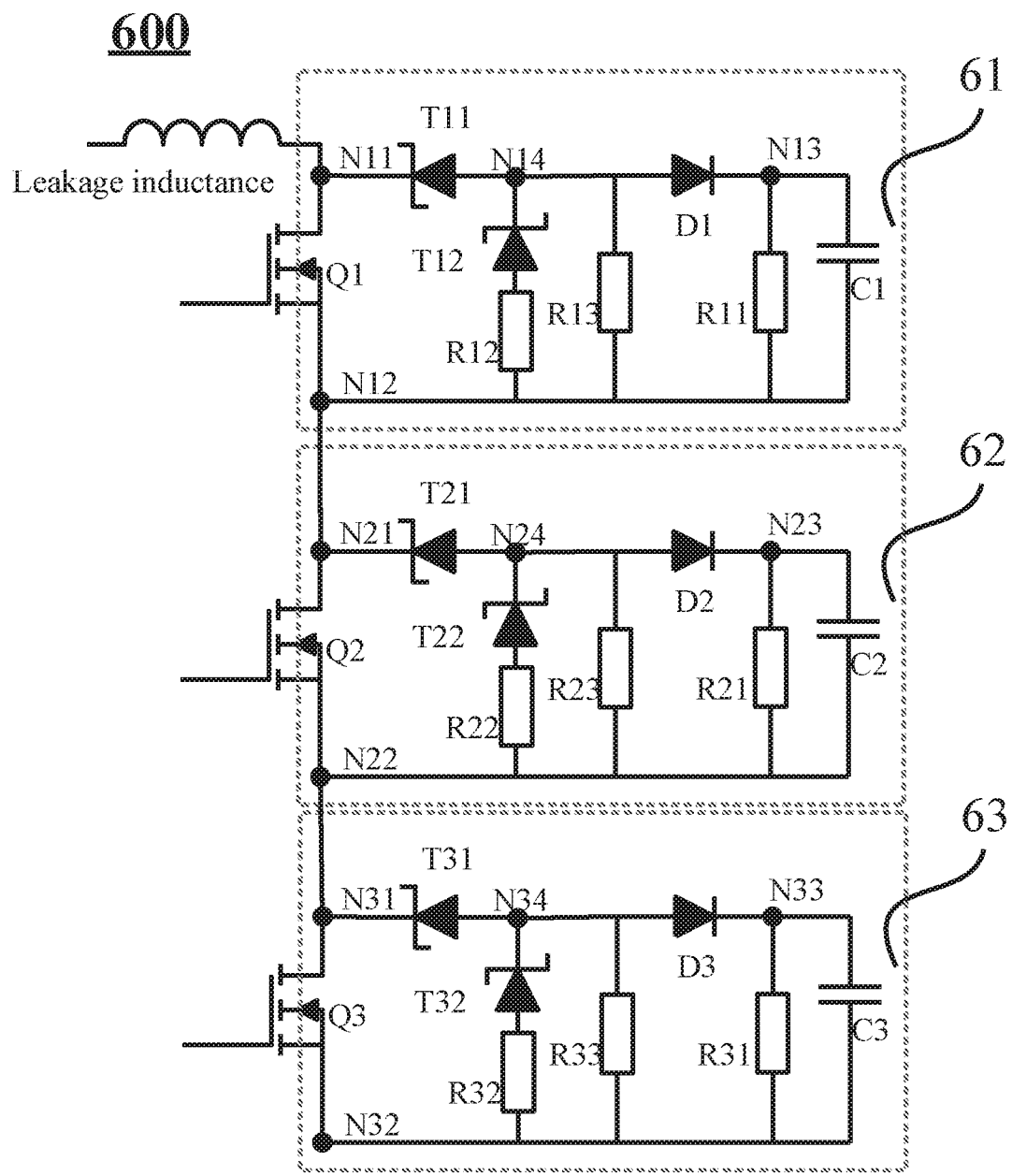
FIG. 6 is a schematic structural diagram of a power module in a sixth embodiment of the present disclosure.

FIG. 6 is a schematic diagram of a power module according to a sixth embodiment of the present disclosure. The embodiment shown in FIG. 6 is a schematic diagram in which the clamp circuit 300 is applied to the power module.

Referring to FIG. 6, in the power module in which a plurality of switching transistors are connected in series, based on the power module 500, N clamp circuits are set by the clamp circuit 300. That is, clamp circuit 6m (for example, clamp circuits 61-63) further includes:

a third resistor Rm3, coupled between the second node Nm2 and the fourth node Nm4, wherein, m is the order number of the switching transistor 6m.

In an exemplary embodiment of the present disclosure, the resistance of the third resistor Rm3 is relatively large, for example, being 1 MΩ.

Referring to FIG. 6, in an exemplary embodiment of the present disclosure, in the N clamp circuits, for example the clamp circuit 6m includes both a second resistor Rm2 and a third resistor Rm3. The resistance of the second resistor Rm2 is relatively small, and the resistance of the third resistor Rm3 is relatively large.

In this case, upon the switching transistor 6m connected in series with other switching transistors in the power module 600 is turned off, before the voltage Vds between the first end and the second end of the switching transistor Qm rises to the reverse breakdown voltage of the first stabilivolt diode diode Tm1, the RCD circuit does not participate in clamping. When the voltage Vds of the first end and second end of the switching transistor Qm exceeds the reverse breakdown voltage of the first stabilivolt diode Tm1, the surge current is injected into the capacitor Cm of the RCD circuit through the first stabilivolt diode Tm1. At this time, a stage of dynamic voltage balancing branch circuit is formed by the first stabilivolt diode Tm1 and the RCD circuit and clamps the voltage across the switching transistor Qm. When the voltage of the capacitor Cm rises to exceed the reverse breakdown voltage of the second stabilivolt diode Tm2, the second stabilivolt diode Tm2 is turned on. At this time, the first stabilivolt diode Tm1, the second stabilivolt diode Tm2 and the second resistor Rm2 together form the second stage dynamic voltage balancing branch circuit to clamp the voltage across the switching transistor Qm, thus providing a stronger clamping effect. When all of the switching transistors connected in series in the power module 600 are in off state, the first stabilivolt diode Tm1 and the third resistor Rm3 form a static voltage balancing branch circuit, which provides a discharge path for the difference of the leakage current among the switching transistor connected in series, thus realizing the static voltage balancing of the switch transistors connected in series in the power module. In this embodiment, since the operating voltage of the RCD circuit in each clamp circuit deceases, components with lower withstand voltage can be adopted for the RCD circuits, thereby reducing the size and cost of the components. Since each clamp circuit is provided with two stages of dynamic voltage balancing branch circuit, the power module 600 has good voltage spike suppression capability, which can improve the reliability of voltage spike clamp. At the same time, since the one stage of static voltage balancing branch circuit is provided in the clamp circuit, the static voltage balancing of the switching transistors connected in series can be realized.

In another exemplary embodiment of the present disclosure, each of the N clamp circuits includes a second resistor and a third resistor. The resistance of the second resistor is relatively large, and the resistance of the third resistor is also relatively large.

Like that in the previous case, in the present embodiment, upon the switching transistor 6m connected in series with other switching transistors in the power module 600 is turned off, before the voltage Vds across the switching transistor Qm rises to the reverse breakdown voltage of the first stabilivolt diode diode Tm1, the RCD circuit does not participate in clamping. When the voltage Vds across the switching transistor Qm exceeds the reverse breakdown voltage of the first stabilivolt diode Tm1, the surge current is absorbed by the RCD circuit through the first stabilivolt diode Tm1. At this time, the first stabilivolt diode Tm1 and the RCD circuit form a stage of dynamic voltage balancing branch circuit, to clamp the voltage across the switching transistor Qm. Different from the previous case is that, in the embodiment, when all the switching transistors connected in series in the power module 600 are in off state, the first stabilivolt diode Tm1 and the third resistor Rm3 form a stage of static voltage balancing branch circuit. The stage of static voltage balancing branch circuit provides a discharge path for the difference of the leakage currents among the switching transistors, which can realize static voltage balancing of the switching transistor connected in series in the power module. When the difference of the leakage currents among the switching transistors connected in series are relatively large, the first stabilivolt diode Tm1, the second stabilivolt diode Tm2 and the second resistor Rm2 form the second stage of static voltage balancing branch circuit to participate in clamping, to clamp the static voltage within a safe range.

In this embodiment, since the operating voltage of the RCD circuit in each clamp circuit deceases, components with lower withstand voltage can be adopted for the RCD circuits, thereby reducing the size and cost of components. Since each clamp circuit is provided with a dynamic voltage balancing branch circuit, the power module 600 has good voltage spike suppression capability, which can improve the reliability of the voltage spike clamp. At the same time, since two stages of static voltage balancing branch circuits are provided in the clamp circuit, the static voltage balancing of the switching transistors connected in series can be realized better.

In summary, the clamp circuit provided by the embodiments of the present disclosure divides the spike voltage across the switching transistor by using a stabilivolt diode, and prevents the clamp circuit from operating before the voltage across the switching transistor is lower than the breakdown voltage of the stabilivolt diode, which can reduce the voltage withstand requirement of components in the RCD clamp circuit, thereby reducing the cost and size of the clamp circuit. Since the threshold that the RCD clamp circuit starts to operate is increased, and the resonance energy of the circuit leakage inductance is reduced, the spike voltage of the switching transistor at turn-off can be lowered. When the clamp circuit is applied to protect the switching transistor connected in series, with the cooperation of the static voltage balancing resistor, the clamp circuit can achieve a good static voltage balancing effect when the switching transistor string is turned off. By setting the two-stage dynamic voltage balancing, the spike voltage at the moment of turn-off can be further absorbed, thereby effectively avoiding overvoltage damage of the switching transistor.

It should be noticed that, although several circuits or units of devices for action execution are mentioned in the detailed description above, such division is not mandatory. Indeed, according to embodiments of the present disclosure, the features and functions of two or more circuits or units described above may be embodied in one circuit or unit. Conversely, the features and functions of one of the circuits or units described above may be further divided into a plurality of circuits or units.

Other embodiments of the present disclosure will be apparent to those skilled in the art from consideration of the specification and practice of the present disclosure disclosed here. The present application is intended to cover any variations, uses, or adaptations of the present disclosure, which are in accordance with the general principles of the disclosure and include common general knowledge or common technical means in the art that are not disclosed in the present disclosure. The specification and embodiments are deemed to be exemplary only and the true scope and idea of this disclosure is indicated by the claims.

What is claimed is:

1. A clamping circuit, coupled to a first end and a second end of a switching transistor through a first node and a second node, comprising:
    a RCD circuit, comprising a first resistor and a first capacitor connected in parallel between the second node and a third node, and a diode having a negative electrode coupled to the third node;
    a first stabilivolt diode, having a negative electrode coupled to the first node and a positive electrode coupled to a positive electrode of the diode at a fourth node;
    a second stabilivolt diode, having a negative electrode coupled to the fourth node; and
    a second resistor, coupled between the second node and a positive electrode of the second stabilivolt diode.

2. The clamp circuit according to claim 1, wherein, when voltage between the first end and the second end of the switching transistor exceeds reverse breakdown voltage of the first stabilivolt diode, the first stabilivolt diode is turned on, and the first stabilivolt diode and the RCD circuit together clamp the voltage between the first end and the second end of the switching transistor.

3. The clamp circuit according to claim 1, wherein, when voltage between the first end and the second end of the switching transistor exceeds reverse breakdown voltage of the first stabilivolt diode, the first stabilivolt diode is turned on, and the first stabilivolt diode and the RCD circuit together clamp the voltage between the first end and the second end of the switching transistor; and when voltage of the first capacitor exceeds reverse breakdown voltage of the second stabilivolt diode, the second stabilivolt diode is turned on, and the first stabilivolt diode, the second stabilivolt diode and the second resistor together clamp the voltage between the first end and the second end of the switching transistor.

4. The clamp circuit according to claim 1, further comprising:
    a third resistor, coupled between the second node and the fourth node.

5. The active clamp circuit according to claim 3, further comprising:
    a third resistor, coupled between the second node and the fourth node.

6. The clamp circuit according to claim 4, wherein, when voltage between the first end and the second end of the switching transistor exceeds reverse breakdown voltage of the first stabilivolt diode, the first stabilivolt diode is turned on, and the first stabilivolt diode and the RCD circuit together clamp the voltage between the first end and the second end of the switching transistor; and when voltage of the first capacitor exceeds reverse breakdown voltage of the second stabilivolt diode, the second stabilivolt diode is turned on, and the first stabilivolt diode, the second stabilivolt diode and the second resistor together clamp the voltage between the first end and the second end of the switching transistor, wherein the first stabilivolt diode and the third resistor are used for discharging leakage current of the switching transistor.

7. The clamp circuit according to claim 5, wherein the first stabilivolt diode and the third resistor are used for discharging leakage current of the switching transistor.

8. A power module, comprising: N switching transistors connected in series with each other and N clamp circuits, wherein each of the clamp circuits is coupled in parallel to a first end and a second end of the corresponding switching transistor through a first node and a second node, and each of the clamp circuits comprises:
    a RCD circuit, comprising a first resistor and a first capacitor connected in parallel between the second node and a third node, and a diode having a negative electrode coupled to the third node;
    a first stabilivolt diode, having a negative electrode coupled to the first node and a positive electrode coupled to a positive electrode of the diode at a fourth node;
    a second stabilivolt diode, having a negative electrode coupled to the fourth node; and
    a second resistor, coupled between the second node and a positive electrode of the second stabilivolt diode.

9. The power module according to claim 8, wherein, in each of the N clamp circuits, when voltage between the first end and the second end of the switching transistor exceeds reverse breakdown voltage of the first stabilivolt diode, the first stabilivolt diode is turned on, and the first stabilivolt diode and the RCD circuit together clamp the voltage between the first end and the second end of the switching transistor.

10. The power module according to claim 8, wherein, in each of the N clamp circuits, when voltage between the first end and the second end of the switching transistor exceeds reverse breakdown voltage of the first stabilivolt diode, the first stabilivolt diode is turned on, and the first stabilivolt diode and the RCD circuit together clamp the voltage between the first end and the second end of the switching transistor; and when voltage of the first capacitor exceeds reverse breakdown voltage of the second stabilivolt diode, the second stabilivolt diode is turned on, and the first stabilivolt diode, the second stabilivolt diode and the second resistor together clamp the voltage between the first end and the second end of the switching transistor.

11. The power module according to claim 8, wherein each of the N clamp circuits further comprising:
    a third resistor, coupled between the second node and the fourth node.

12. The power module according to claim 11, wherein, in each of the N clamp circuits, when voltage between the first end and the second end of the switching transistor exceeds reverse breakdown voltage of the first stabilivolt diode, the first stabilivolt diode is turned on, and the first stabilivolt diode and the RCD circuit together clamp the voltage between the first end and the second end of the switching transistor; and when voltage of the first capacitor exceeds reverse breakdown voltage of the second stabilivolt diode, the second stabilivolt diode is turned on, and the first stabilivolt diode, the second stabilivolt diode and the second resistor together clamp the voltage between the first end and the second end of the switching transistor, wherein the first stabilivolt diode and the third resistor are used for discharging leakage current of the switching transistor.

13. The power module according to claim 12, wherein, any one or more of the N clamp circuits simultaneously comprises the second resistor and the third resistor.

* * * * *